United States Patent [19]

Orcutt et al.

[11] Patent Number: 5,556,022

[45] Date of Patent: Sep. 17, 1996

[54] POLAR BOND HEAD

[75] Inventors: John W. Orcutt; Galle Lin, both of Richardson, Tex.

[73] Assignee: Texas Instruments Incorporated, Dallas, Tex.

[21] Appl. No.: 254,225

[22] Filed: Jun. 6, 1994

Related U.S. Application Data

[63] Continuation of Ser. No. 983,092, Nov. 23, 1992, Pat. No. 5,330,089, which is a continuation of Ser. No. 691,944, Apr. 26, 1991.

[51] Int. Cl.$^6$ ...................................................... B23K 1/06
[52] U.S. Cl. ......................... 228/1.1; 108/140; 74/479.01
[58] Field of Search ............................... 228/1.1, 4.5, 6.2; 74/479 PP, 479.01; 414/917; 108/140, 137

[56] References Cited

U.S. PATENT DOCUMENTS

| | | | |
|---|---|---|---|
| 4,445,633 | 5/1984 | Bonham, Jr. ............................... | 228/102 |
| 4,507,597 | 3/1985 | Trost .......................................... | 318/38 |
| 4,550,871 | 11/1985 | Chan et al. ................................ | 228/4.5 |
| 4,610,387 | 9/1986 | Scavino ..................................... | 228/1.1 |
| 4,659,278 | 4/1987 | Doege ....................................... | 414/917 |
| 4,808,892 | 2/1989 | Dreibelbis ................................. | 318/135 |
| 4,904,152 | 2/1990 | Doi ............................................ | 414/917 |
| 5,060,841 | 10/1991 | Oshima et al. ........................... | 228/102 |
| 5,078,312 | 1/1992 | Ohashi et al. ............................. | 228/1.1 |
| 5,169,050 | 12/1992 | Montagu ................................... | 228/4.5 |
| 5,330,089 | 7/1994 | Orcutt et al. .............................. | 228/1.1 |
| 5,340,010 | 8/1994 | Torihata ................................... | 228/1.1 |

FOREIGN PATENT DOCUMENTS

| | | | |
|---|---|---|---|
| 58-184734 | 10/1983 | Japan ....................................... | 228/4.5 |
| 61-163648 | 7/1986 | Japan ....................................... | 228/4.5 |
| 61-201434 | 9/1986 | Japan ....................................... | 228/4.5 |
| 62-21234 | 1/1987 | Japan ....................................... | 228/4.5 |
| 0598751 | 3/1978 | U.S.S.R. ................................... | 228/4.5 |

*Primary Examiner*—Jack W. Lavinder
*Assistant Examiner*—James Miner
*Attorney, Agent, or Firm*—W. James Brady, III; Richard L. Donaldson

[57] ABSTRACT

A polar motion bond head for bonding semiconductor devices includes voice coil motors for providing positioning motion to the bond head, and a vision system that has an optical path that allows the camera to see all polar positions with the image staying on the camera centerline.

8 Claims, 4 Drawing Sheets

POLAR BOND HEAD

This is a continuation, of application Ser. No. 07/983,092, filed Nov. 23, 1992, now U.S. Pat. No. 5,330,089 which is a continuation of application Ser. No. 07/691,944 filed Apr. 26, 1991 now abandoned.

FIELD OF THE INVENTION

This invention relates to wire bonders used in the manufacture of semiconductor devices, and more particularly to a wire bonder having a polar motion bond head.

BACKGROUND OF THE INVENTION

Conventional semiconductor wire bonders use X-Y tables to move the bond head over the semiconductor device for bonding lead wires between the semiconductor device and its leadframe fingers. Sometimes the leadframe is replaced by other appropriate electrical connections such as a ceramic package, hybrid circuit, or other semiconductor device. The X-Y coordinate tables are driven by complex mechanical components that convert the rotary motion of the axis drive motor to controlled linear motion. Typical mechanical components may include lead screws, ball nuts, encoders, shaft and thrust bearings, and couplings, all of which reduce mechanical reliability. The bond head moved by conventional X-Y coordinate tables, carries several components such as a Z-axis drive motor, a camera for vision functions, and other components required to bond the lead wires. Such components add weight to the moving bond head, reducing maximum available table acceleration, and induce vibrations on stopping, which also increases bonding time and limits the bonder productivity. Conventional bond heads also employ flex pivots, shaft and bearings, or other point flex mechanisms to produce Z-axis motion through an arc which only allows the bond tool to be square to the bonding surfaces at only one bonding height. This inability to be square at all bonding heights causes bonding problems as the die and lead fingers are usually at different heights due to product requirements, which is further complicated by thickness variations of die, die bond material and the leadframe.

In other bonders, the X-Y table may be driven by linear motors or voice coil motors. Voice coil motors simplify gearing required by other motor drives, and eliminates ball-screw drives and slides used on some conventional X-Y tables.

BRIEF SUMMARY OF THE INVENTION

The invention is a wire bond machine for, but not limited to, semiconductor devices where the conventional X-Y coordinate bond head table is replaced by a polar coordinate table that is driven directly with a fixed field magnet, linear voice coil actuators, to reduce mechanical components for better reliability. The bond tool is always perpendicular to the bonding surface which improves bonding consistency. The Z-axis motor is either partially or totally fixed, and not carried by the polar table. A vision function camera is located in a fixed position, reducing mass carried by the polar coordinate table and produces minimum settling time and maximum acceleration of the bond head.

The wire bond head is moved linearly by a first voice coil actuator, and through an angle actuated by a second voice coil actuator. The bond head is mounted on a shaft that may include an air bearing such that when the first voice coil is energized, the bond head frame moves linearly, its speed and direction of movement controlled by the voice coil current and polarity. The bond head frame pivots around a fixed point. The pivot member is a flexible piece of spring steel or bearing system. Sensors measure the angular and linear motion of the bondhead table which feed polar table positions to a control computer that drives the voice coil actuators. The bonding locations on the semiconductor device and lead frame which are normally registered by rectangular coordinates, found in polar coordinates by x=(R+Delta R)cosine theta and Y=(R+delta R) tangent Theta. The bond head is moved vertically, in the Z-direction by a third voice coil motor.

A camera or vision apparatus is mounted at the pivot point of the bond head frame and "views" the bonding area through lenses and 45 degree mirror prisms.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

Figure 1:
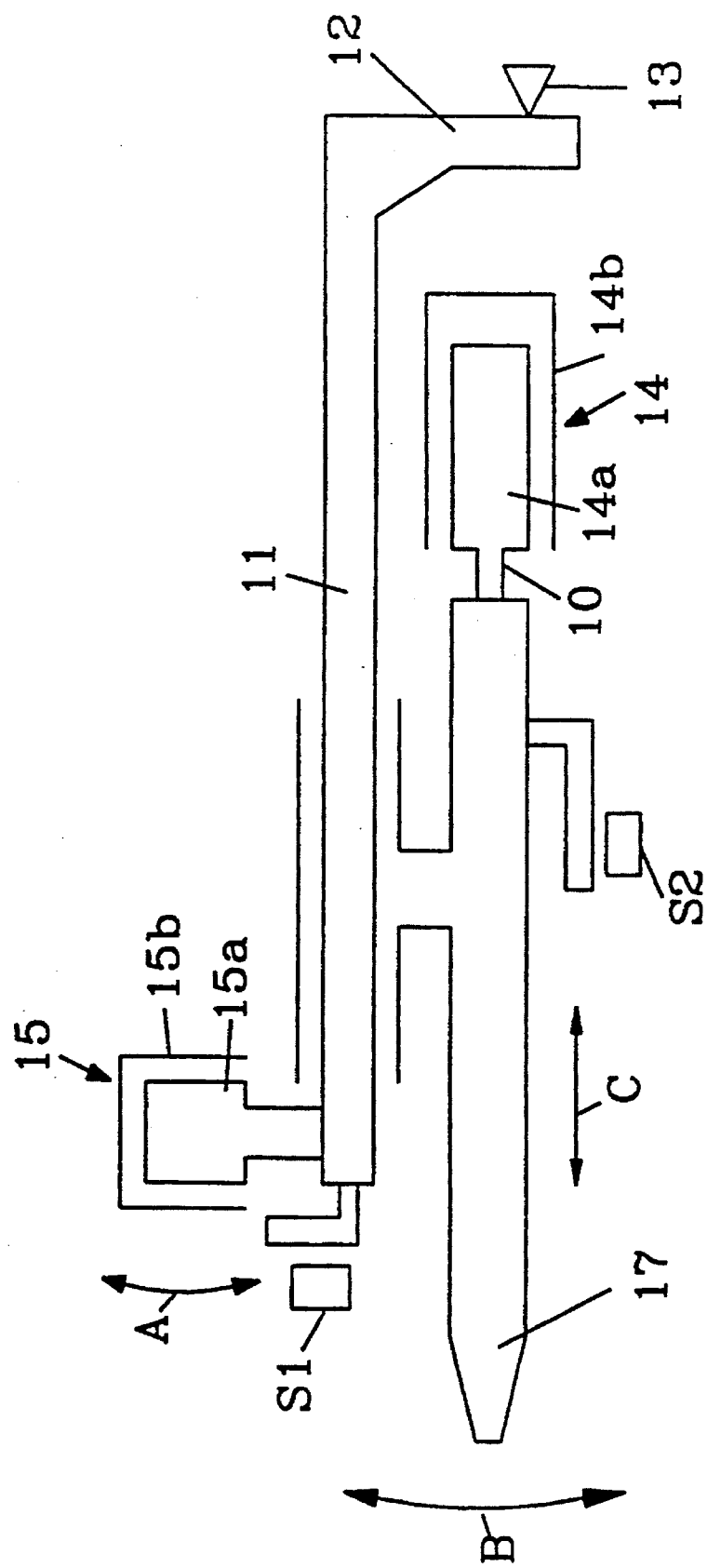
FIG. 1 is a simplified illustration of the polar table portion of the invention.

FIG. 1 is a simplified illustration of the polar portion of the invention. The radius portion of the polar motion is provided by linear motor 14 which has its field magnet 14b fixed in place, and its movable coil 14a attached to table rod 10. Current flowing through coils 14a will react with field magnet 14b, driving coil 14a and table rod 10 back and forth on theta rod 11, as indicated by arrow "C", producing the radius portion of a polar coordinate motion.

The angular or theta portion of the polar motion is provided by linear motor 15, which has its field magnet 15b, fixed in place, and movable coil 15a, attached to theta rod 11. Theta rod 11 is attached to pivot 13 by mount 12. Current flow through coil 15a will react with field magnet 15b, moving coil 15a as indicated by arrow "A", driving theta rod 11 and bond head cone 17 about pivot 13, as indicated by arrow "B", producing the theta portion of a polar coordinate motion. Motion of the radius and theta portions of the polar coordinate motions are monitored by sensors $S_2$ and $S_1$, respectively.

The radius dimension of the polar coordinates is made much larger than the specified theta motion to limit the required theta angle and clearance between coil 14a and 15a to their field magnets 14b and 15b, respectively, such that there is no contact required during theta and radius polar motions.

Figure 2:
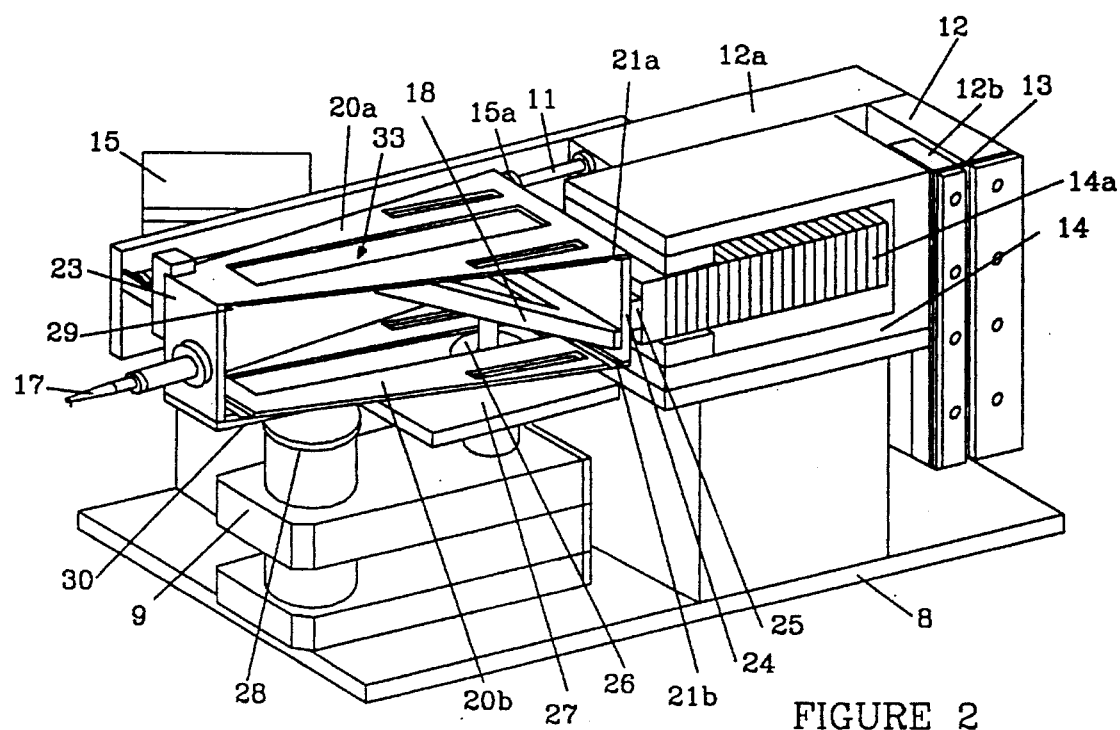
FIG. 2 is an isometric illustration of a parallel flex arm bond head mounted on the polar table with a fixed Z-axis drive motor.

FIG. 2 is an isometric illustration of a parallel flex arm bond head assembly 33 mounted on a polar table with a fixed Z-axis voice coil drive motor. Bond head assembly 33 is mounted to the table rod 10 (FIG. 3) by back plate 24 (FIG. 4), which is driven in polar coordinates by radius polar linear motor 14 and theta polar linear motor 15. Parallel arms 20a and 20b, allow bond head face plate 23 to move in the Z-axis through an arc described by the length of the parallel arms 20a, 20b with bond head face plate 23 maintained parallel to the rear mounting plate 24. Ultrasonic horn 17 is mounted to bond head face 23 and moves in the same Z motion with its Z-axis always parallel to rear mounting plate 24. Plate 18 is attached to and moves with bond head assembly 33, and is part of the bond head moving support mechanism, 26 and 27, which keeps the rear mounting plate 24 square to the motion of the bond head assembly 33.

Bond head face plate 23 is driven in the Z-axis by motor assembly 9 and 28, through bottom interface plate 19 (FIG. 3) which provides a planar coupling to the moving bond head interface plate 30. Z-axis sensor $S_3$ (FIG. 4) monitors position for feed back to electronic motor control.

Figure 3:
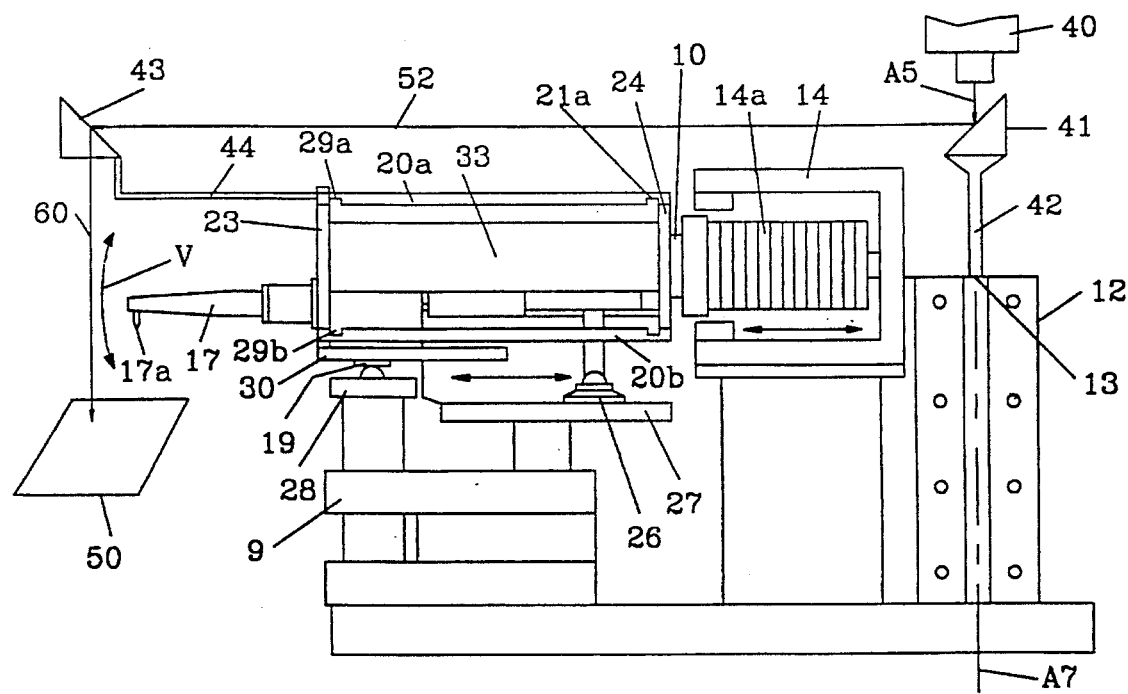
FIG. 3 is a side view of the parallel flex arm bond head mounted on the polar table with a fixed Z-axis drive motor and a stationary vision function camera and system.

FIG. 3 is a side view of the parallel flex arm bond head mounted on the polar table with a fixed Z-axis drive motor 19 and stationary vision function camera 40. Bond head assembly 33 is mounted to the polar coordinate table by back plate 24. Parallel arms 20a and 20b connect bond head face 23 to back plate 24. Reduced areas 21a, 21b and 29a, 29b, provide a pivoting action, allowing bond head face plate 23 to move through arc V for bond head Z-axis motion. Parallel arms 20a and 20b keep the bond head face plate 23 parallel to back plate 24, eliminating rocking motion of a single pivot bond head system. Parallel Z motion of bond head face plate 23 to bond head back plate 24 allows the bond head and ultrasonic horn 17 to remain square to the materials being bonded regardless of material bond height.

Stationary Z-axis motor 9 uses output shaft 28 to control the position of bond head face 23 through a planar coupling interface 19 and moving bond head interface plate 30.

Vision function camera 40 is mounted so its optical centerline A5 is on the vertical theta motion centerline A7 of the polar table. A 45 degree mirror 41 is also mounted on theta rotation centerline A7 (FIG. 3), but rotates with the theta motion of the polar table and is aimed at a second 45 degree mirror 43. Mirror 43 is located in front of bonding tool 17a, mounted to bond head plate 23, and moves with all polar coordinates. This optical path, (A5, 52 and 60), allows the camera to see all polar positions with the image staying on the camera centerline. Lens and other optical components are added to the optical path as required for correction vision pictures.

The vision camera can be mounted off centerline A5 and a third mirror/prism (not illustrated) can be used to reflect the field of view into the camera lens.

Figure 3A:
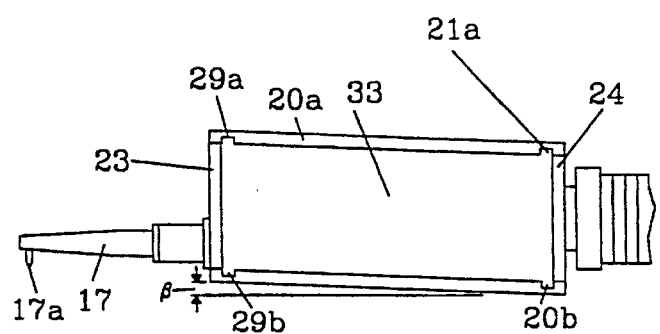
FIG. 3a is a partial view of the bond head illustrating vertical motion of the bond head.

FIG. 3a illustrates the vertical motion of the bond head. Back plate 24 is attached to field magnet coil 14a by rod 10. As the flex head bond head assembly 33 is moved vertically, the arms 20a and 20b are flexed, at reduced areas 21a, 21b, 29a and 29b, such that face plate 23 remains parallel to back plate 24. As illustrated, the bond head assembly 33 is move through angle β.

Figure 4:
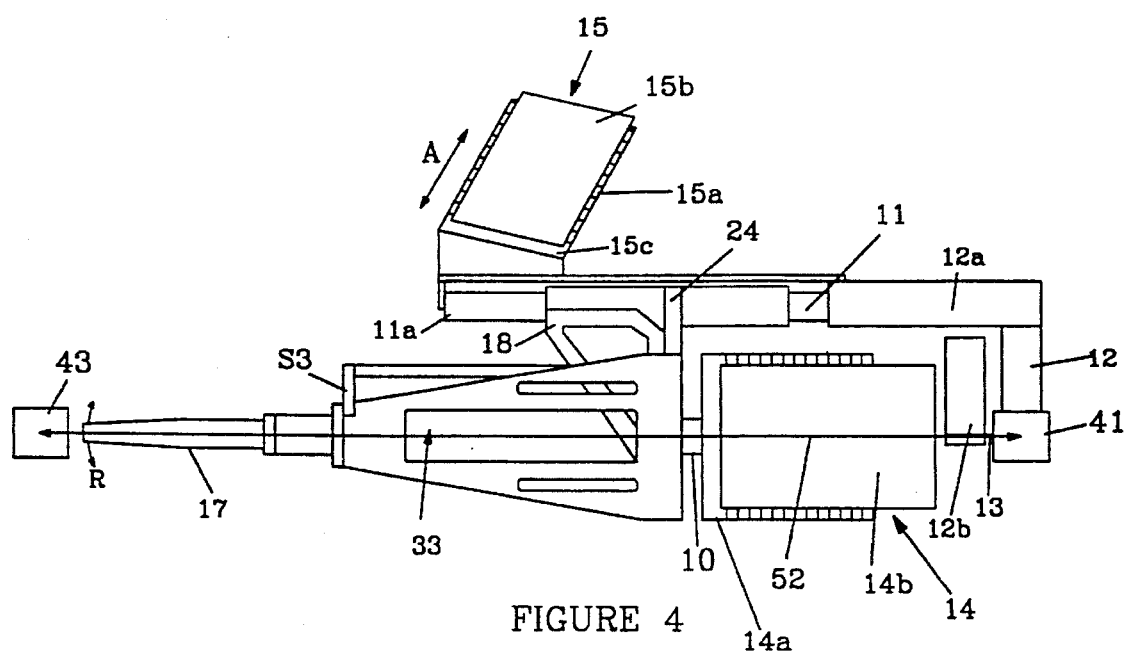
FIG. 4 is a top view of the bonder of FIG. 3.

FIG. 4 is a top view of the parallel flex arm bond head mounted on the polar table. Radius motor field magnet 14b, theta motor field magnet 15b, and theta flex mount 12b are all fixed and to not move relative to one another. Theta rod 11 is attached to theta motor coil 15a and theta pivot 13 by moving parts 12, 12a and 11a. Current flow in the theta motor 15 causes the coil 15a to move in or out of theta motor field magnet 15b as indicated by arc A, The pivot or angular motion theta is centered about flex pivot 13. This angular or arc motion provides the theta portion of traditional polar coordinate motion. Polar table 33 slides up and down theta rod 11 and is attached to radius motor coil 14a. Current flow in radius motor coil 14a causes the coil to move in and out on centerline of theta rod 11. This motion provides the radius portion of traditional polar coordinate motion.

The radius dimension of the polar coordinates is made much larger than the specified theta angular motion to limit the required theta angle, and clearances between coil 14a and 15a to their field magnets 14b and 15b, respectively, such that there is no contact during required theta and radius polar motions.

What is claimed:

1. A polar motion table, comprising:

a table;

a pivot attached to said table;

a frame support attached to said pivot;

a frame mounted on said frame support;

a first motor for moving said frame with respect to said frame support in a linear direction, said linear direction extending generally radially with respect to said pivot; and a second motor for moving said frame through an arc about said pivot.

2. The polar motion table of claim 1, further comprising:

a tool mounted on said frame.

3. The polar motion table of claim 2, in which said tool is an ultrasonic horn.

4. The polar motion table of claim 1, in which said frame includes:

a pair of parallel arms having first and second ends;

a face plate connected to the first ends of said parallel arms; and a back plate connected to the second ends of said parallel ends.

5. The polar motion table of claim 4, further comprising:

a third motor for pivoting said parallel arms through an angle in a second plane perpendicular to said first plane, said face plate and said back plate remaining parallel during pivoting of said parallel arms.

6. The polar motion table of claim 5, further comprising a tool attached to said face plate.

7. The polar motion table of claim 6, in which said tool is an ultrasonic horn.

8. The polar motion table of claim 1, in which said first motor includes:

a fixed field magnet; and a movable coil attached to said frame.

* * * * *